US012002521B2

(12) United States Patent
Cariello

(10) Patent No.: US 12,002,521 B2
(45) Date of Patent: *Jun. 4, 2024

(54) MEMORY DEVICE ERROR DETECTION WITH IMPROVED SCANNING

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

This patent is subject to a terminal disclaimer.

(21) Appl. No.: 17/470,550

(22) Filed: Sep. 9, 2021

(65) Prior Publication Data

US 2021/0407600 A1 Dec. 30, 2021

Related U.S. Application Data

(63) Continuation of application No. 16/235,745, filed on Dec. 28, 2018, now Pat. No. 11,139,035.

(51) Int. Cl.
*G11C 16/34* (2006.01)
*G06F 3/06* (2006.01)
(Continued)

(52) U.S. Cl.
CPC ........ *G11C 16/3422* (2013.01); *G06F 3/0604* (2013.01); *G06F 3/0659* (2013.01);
(Continued)

(58) Field of Classification Search
CPC . G11C 29/44; G11C 16/3422; G11C 11/5628; G11C 11/5642; G11C 16/0483;
(Continued)

(56) References Cited

U.S. PATENT DOCUMENTS 11,139,035 B2 10/2021 Cariello
2014/0173172 A1 6/2014 Yang et al.
(Continued)

FOREIGN PATENT DOCUMENTS

CN 111538610 8/2020

OTHER PUBLICATIONS

"Chinese Application Serial No. 201911382798.X, Office Action dated Jan. 5, 2023", with machine English translation, 27 pages.

*Primary Examiner* — Donald H B Braswell

(74) *Attorney, Agent, or Firm* — Schwegman Lundberg & Woessner, P.A.

(57) ABSTRACT

A memory device may include memory cells configured to establish multiple levels of charge distributions; and a memory controller configured to perform operations on the memory cells. The operations may include recording a bit count number for a highest level of charge distributions within a set of memory cells, recording a bit count number for a lowest level of charge distributions within the set of memory cells, counting bits for the highest level of charge distributions within the set of memory cells, counting bits in the lowest level of charge distributions within the set of memory cells, comparing the counted bits for the highest level to the recorded bit count number for the highest level, and comparing the counted bits for the lowest level to the recorded bit count number for the lowest level.

22 Claims, 11 Drawing Sheets

(51) Int. Cl.
  *G11C 11/56* (2006.01)
  *G11C 16/04* (2006.01)
  *G11C 16/10* (2006.01)
  *G11C 16/32* (2006.01)

(52) U.S. Cl.
  CPC ........ *G06F 3/0679* (2013.01); *G11C 11/5628* (2013.01); *G11C 11/5642* (2013.01); *G11C 16/0483* (2013.01); *G11C 16/10* (2013.01); *G11C 16/32* (2013.01)

(58) Field of Classification Search
  CPC ....... G11C 16/10; G11C 16/32; G06F 3/0604; G06F 3/0659; G06F 3/0679
  See application file for complete search history.

(56) References Cited

U.S. PATENT DOCUMENTS

| | | |
|---|---|---|
| 2016/0086675 A1 | 3/2016 | Ray et al. |
| 2017/0263310 A1* | 9/2017 | Hung .................... G06F 11/108 |
| 2018/0197619 A1 | 7/2018 | Chen et al. |
| 2018/0277226 A1* | 9/2018 | Tokutomi ............... G11C 16/34 |
| 2019/0295606 A1 | 9/2019 | Parry et al. |
| 2019/0348124 A1 | 11/2019 | Kim |
| 2019/0371418 A1* | 12/2019 | Kim .................... G11C 16/0483 |
| 2019/0378583 A1* | 12/2019 | Lien ....................... G11C 16/10 |
| 2020/0104209 A1* | 4/2020 | El Gamal .............. G11C 29/52 |
| 2020/0211662 A1 | 7/2020 | Cariello |

\* cited by examiner

MEMORY DEVICE ERROR DETECTION WITH IMPROVED SCANNING

PRIORITY APPLICATION

This application is a continuation of U.S. application Ser. No. 16/235,745, filed Dec. 28, 2018, which is incorporated herein by reference in its entirety.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magneto resistive random-access memory (MRAM), or storage class (e.g., memristor) memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values).

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Memory arrays or devices can be combined together to form a storage volume of a memory system, such as a solid state drive (SSD), a Universal Flash Storage (UFS) device, multimedia card (MMC) solid-state storage devices, and embedded MMC (eMMC) devices. These devices can be used as, among other things, the main storage device of a computer, having advantages over traditional hard drives with moving parts with respect to, for example, performance, size, weight, ruggedness, operating temperature range, and power consumption. For example, these devices can have reduced seek time, latency, or other electromechanical delay associated with magnetic disk drives. These devices may also use non-volatile flash memory cells to obviate internal battery supply requirements, thus allowing the drive to be more versatile and compact.

These solid state devices can include a number of memory devices, including a number of dies or logical units (LUNs). Each die can include a number of memory arrays and peripheral circuitry thereon, and the memory arrays can include a number of blocks of memory cells organized into a number of physical pages. The solid state devices can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

Various embodiments are illustrated by way of example in the figures of the accompanying drawings. Such embodiments are demonstrative and not intended to be exhaustive or exclusive embodiments of the present subject matter.

DETAILED DESCRIPTION

Figure 1:
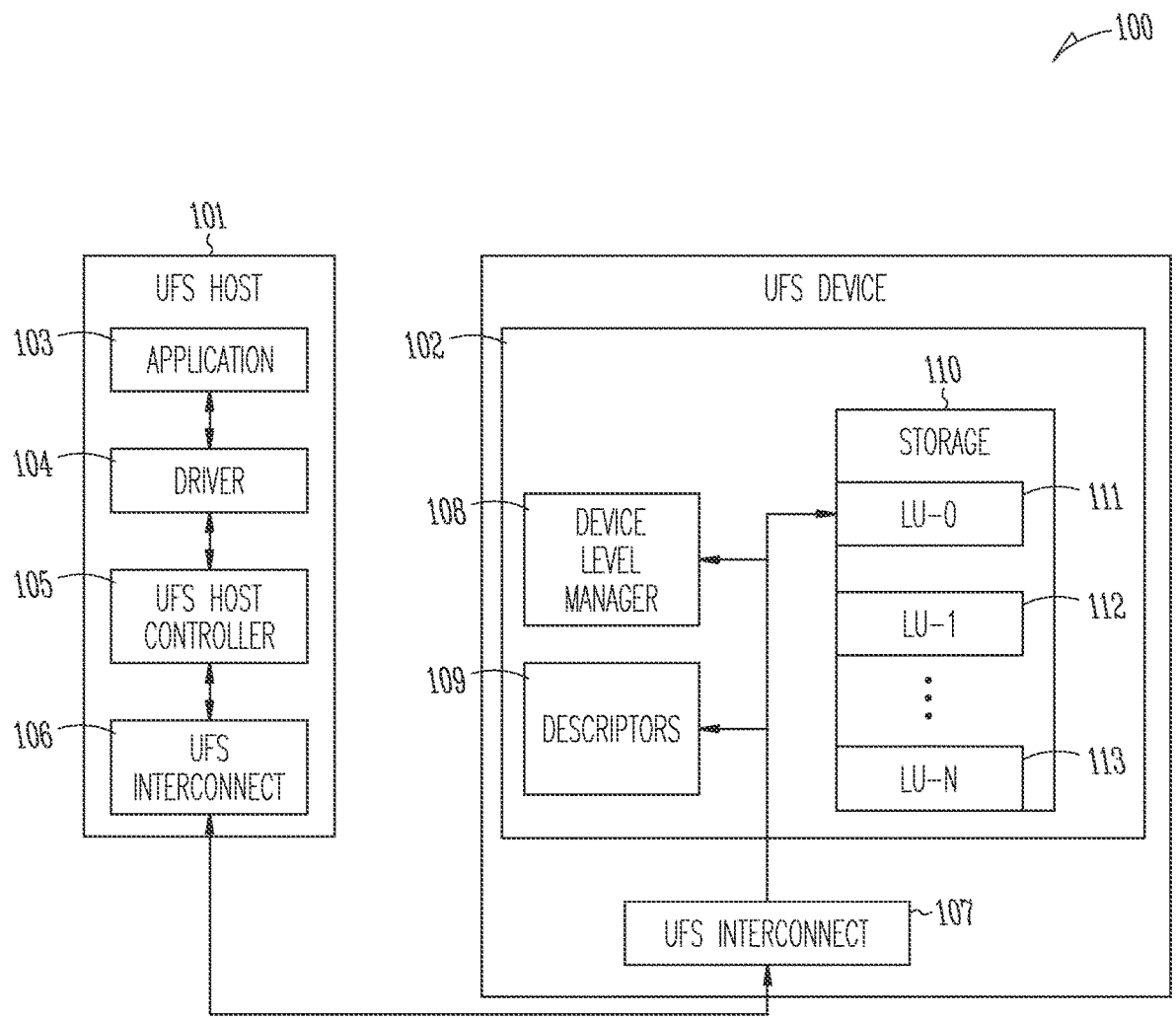
FIG. 1 shows a diagram of an example of a UFS system.

Some mobile electronic devices, such as smart phones, tablets, etc., can be broken down into several main components: a processor (e.g., a central processing unit (CPU) or other main processor); a graphics processing unit (GPU); memory (e.g., random access memory (RAM), such as dynamic RAM (DRAM), mobile or low-power DDR RAM, etc.); a storage device (e.g., non-volatile memory (NVM) device, such as flash memory, read-only memory (ROM), a solid state drive (SSD), or other memory device, etc.); and a user-interface (e.g., a display, touch-screen, keyboard, one or more buttons, etc.). Different electronic devices have different storage needs.

Software (e.g., programs), instructions, the operating system (OS), and other data are stored on the storage device, and are loaded into memory for use by the processor. Memory (e.g., DRAM) is typically faster, but volatile, and thus a different type of storage than the storage device (e.g., an SSD), which is suitable for long term storage, including while in an "off" condition. Programs, instructions, or data in use by a user or the mobile electronic device are typically loaded in memory for use by the processor.

Storage devices optimized for mobile electronic devices, or mobile storage, traditionally include either discrete memory devices and/or removable storage devices (for example, multimedia card (MMC) solid-state storage devices (e.g., micro secure digital (SD) cards, etc.). MMC devices include a number of parallel interfaces (e.g., an 8-bit parallel interface) with a host device, and are often removable and separate components from the host device. In contrast, embedded MMC (eMMC) devices are attached to a circuit board and considered a component of the host device, with read speeds that rival serial ATA (SATA) based SSD devices. However, demand for mobile device performance continues to increase, such as to fully enable virtual or augmented-reality devices, utilize increasing networks speeds, etc. In response, storage devices have shifted from parallel to serial communication interfaces. Universal flash storage (UFS) devices, including controllers and firmware, communicate with a host device using a low-voltage differential signaling (LVDS) serial interface with dedicated read/write paths, further advancing greater read/write speeds. UFS devices may be used with mobile devices as discussed above or other electronic devices.

The reliability of memory cells may be impacted as the memory scales smaller. For example, high-density NANDs may be susceptible to charge leakage and read/program disturb errors. Techniques have been developed to address detected errors in the memory. The present subject matter provides a fast and low-power technique to detect errors in the memory. The present inventors recognized that, because the effect of charge loss is more visible on the higher Vt distribution and the effect of read and program disturb mainly create a high tail on the lower (erased) distribution, it may be sufficient to count the bits in the highest VT distribution and the lowest VT distribution a single strobe to detect errors in the memory. The detection of errors in the memory by tracking bit counts in the highest VT distribution and the lowest VT distribution will be discussed in more detail below after an overview of systems that include memory devices.

FIG. 1 shows a diagram of an example of a UFS system 100. The illustrated UFS system 100 may include a UFS host 101 and a UFS device 102. The UFS host 1010 includes an application 103 that wishes to read or write data to the UFS device 102. The application 103 on the UFS host 101 uses a UFS driver 104, which manages the UFS host controller 105 through a UFS Host Controller Interface using a set of registers. The UFS host controller 105 uses the UFS interconnect 106 to communicate with the UFS interconnect 107 of the UFS device 102. The UFS interconnect comprises the physical layer and provides basic transfer capabilities. The physical layer may be a differential, dual simplex PHY that includes TX and RX pairs. A PHY refers to the circuitry used to implement physical layer function, and connects a link layer device (often called MAC as an acronym for medium access control) to a physical medium. The UFS interconnect 107 communicates with the components of the UFS device 102. UFS device 102 includes a device level manager 108 that provides device level features such as power management, and the like. Descriptors 109 store configuration related information. Storage 110 may be segmented into a plurality of Logical Unit (LU)s 0-N (111, 112, 113) which handle read/write and other storage related commands. For example, a 16 GB UFS device might be configured as 4 LUs of 4 GB each.

While the disclosure herein may be described with respect to UFS, one of ordinary skill in the art with the benefit of the present disclosure will recognize that the disclosed improvements may also be applied to eMMC and other interfaces between a storage device and a host.

Figure 2:
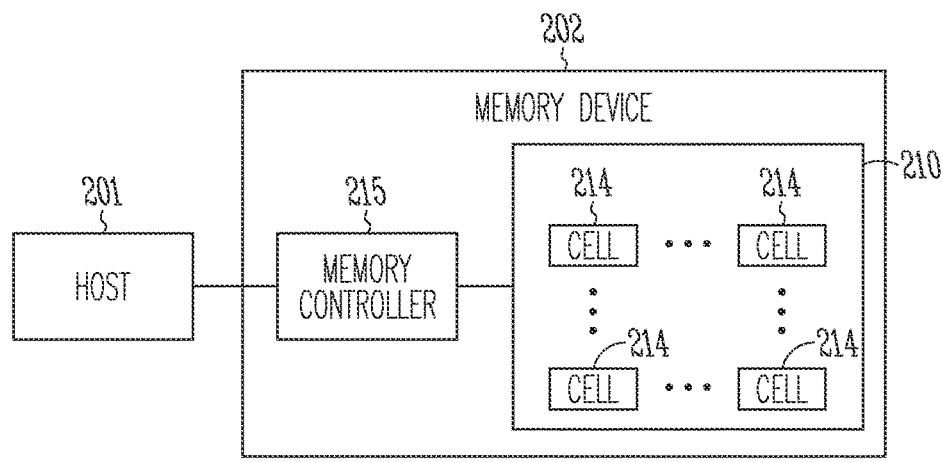
FIG. 2 illustrates an example block diagram of a memory device including a memory controller and a memory array.

FIG. 2 illustrates an example block diagram of a memory device 202 including a memory controller 215 and a memory array 210 having a plurality of memory cells 214, and a host 201 external to the memory device 202. One or more physical interfaces can be used to transfer data between the memory device 202 and the host 201. By way of example and not limitation, the physical interface(s) may include a serial advanced technology attachment (SATA) interface, a peripheral component interconnect express (PCIe) interface, a universal serial bus (USB) interface, M-PHY for UFS, 8-bit parallel, eMMC, or one or more other physical connectors or interfaces. The host 201 can include a host system, such as a personal computer, a digital camera, a mobile electronic device, a memory card reader, or one or more other electronic devices external to the memory device 202.

The memory controller 215 can receive instructions from the host 201, and can communicate with the memory array 210, such as to transfer data to (e.g., write or erase) or from (e.g., read) one or more of the memory cells 214 of the memory array 210. The memory controller 215 can include, among other things, circuitry or firmware. For example, the memory controller 215 can include one or more memory control units, circuits, or components configured to control access across the memory array 210 and to provide a translation layer between the host 201 and the memory device 202. The memory controller 215 can include one or more input/output (I/O) circuits, lines, or interfaces to transfer data to or from the memory array 210.

Figure 3:
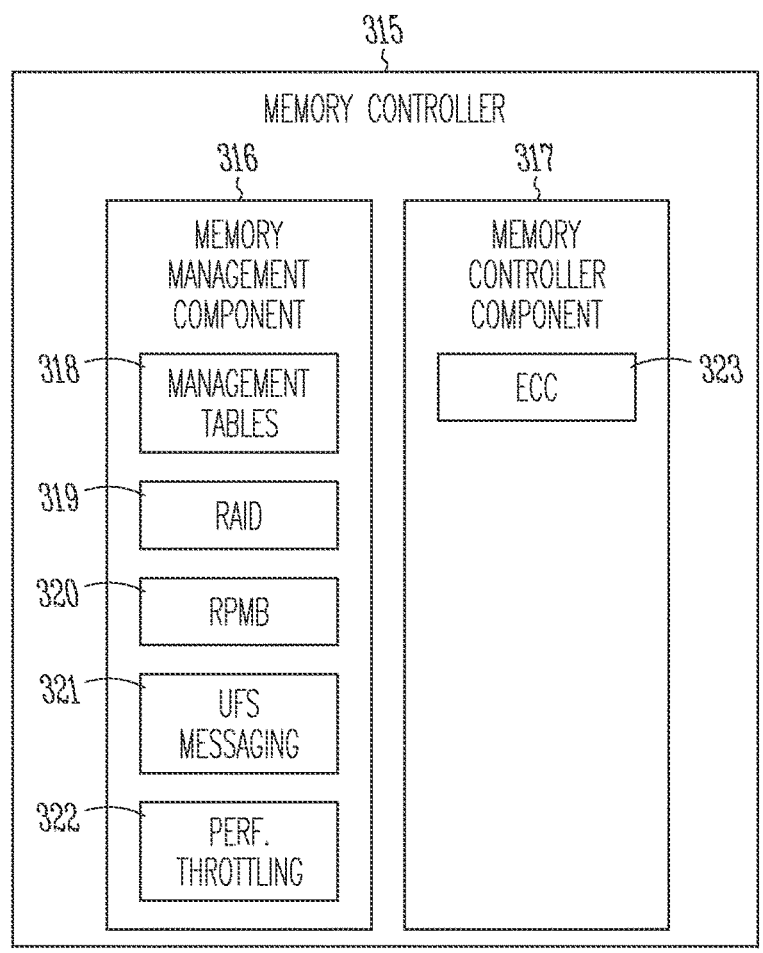
FIG. 3 illustrates an example block diagram of a memory controller.

FIG. 3 illustrates an example block diagram of a memory controller 315 such as memory controller 215 illustrated in FIG. 2 The illustrated memory controller 315 includes a memory management component 316 and a memory controller component 317. The memory management component 316 may include, among other things, circuitry or firmware, such as a number of components or integrated circuits associated with various memory management functions, including wear leveling (e.g., garbage collection or reclamation), error detection or correction, block retirement, or one or more other memory management functions. The memory management component 316 may parse or format host commands (e.g., commands received from a host) into device commands (e.g., commands associated with operation of a memory array, etc.), or generate device commands (e.g., to accomplish various memory management functions) for the memory controller component 317 or one or more other components of a memory device.

The memory management component 316 can include management tables 318 configured to maintain various information associated with one or more component of the memory device (e.g., various information associated with a memory array or one or more memory cells coupled to the memory controller 315). For example, the management tables 318 can include information regarding block age, block erase count, error history, or one or more error counts (e.g., a write operation error count, a read bit error count, a read operation error count, an erase error count, etc.) for one or more blocks of memory cells coupled to the memory controller 315. In certain examples, if the number of detected errors for one or more of the error counts is above a threshold, the bit error can be referred to as an uncorrectable bit error. The management tables 318 can maintain a count of correctable or uncorrectable bit errors, among other things.

The memory management component 316 can include a redundant array of independent disks (RAID) unit 319 (the term "disks" is a carryover from prior implementations using had disk drives, and does not require that the RAID unit 319 include a physical disk). The RAID unit 319 can provide data reliability through, among other things, redundant memory operations and redundant memory storage.

The memory management component 316 may include a protected memory function such as a Replay Protected Memory Block (RPMB) function 320. RPMB, for example, provides means for the host system 201 to store data to the specific memory area in an authenticated and replay protected manner by the device 202. To provide RPMB, first programming authentication key information is provided to the UFS device memory. The authentication key is used to sign the read and write accesses made to the replay protected memory area with a Message Authentication Code (MAC). RPMB allows for secure storage of sensitive data such as digital rights management (DRM) keys. The RPMB cannot be accessed via normal means, but is instead accessed using a set of specific commands using a secure protocol. RPMB is authenticated using a security key.

The memory management component 316 may include a UFS messaging 321. Messages transfer information between a UFS host and device. The messages may include UFS Protocol Information Units (UPIU), which are defined data structures that contain a number of sequentially addressed bytes arranged as various information fields. There are different types of UPIU. All UPIU structures contain a common header area at the beginning of the data structure (lowest address). The remaining fields of the structure vary according to the type of UPIU.

The memory management component 316 may include Performance Throttling 322, which provides device side control of the data transfer speed. Storage devices (such as NAND devices) may have one or more indicators that trigger performance throttling to prevent damage to the storage device, prevent errors when reading values from the storage device, and the like. For example, high temperatures (either ambient temperatures or device temperatures) can impact the reliability of the storage device, and may cause increased power consumption due to increased transistor leakage at high temperatures. The storage device may have the ability to throttle performance to reduce self-heating to help control device temperature and to avoid excessive power consumption. For example, circuitry and/or firmware within the controller of the memory device may respond to a temperature sensor output indicating the crossing of a temperature threshold (either internal or external ambient sensors), by setting a temperature too high exception event register, and throttling performance. In other examples, the circuitry and/or firmware may set a performance throttling exception event register and throttle performance. Throttling could mean accessing fewer NAND memory cells in parallel, accessing the NAND memory cells (such as pages) with a reduced NAND interface speed, and the like. As described in more detail below, various embodiments may enforce a memory device policy using performance throttling to adjust memory device performance.

The memory controller component 317 may include, among other things, circuitry or components configured to control memory operations associated with writing data to, reading data from, or erasing one or more memory cells of a memory device coupled to the memory controller 315. The memory operations can be based on, for example, host commands received from a host, or internally generated by the memory management component 316 or the memory controller component 317 (e.g., in association with wear leveling, error detection or correction, etc.). The memory controller component 317 may include an error correction code (ECC) component 323, which can include, among other things, an ECC engine or other circuitry configured to detect or correct errors associated with writing data to or reading data from one or more memory cells of a memory device coupled to the memory controller 315. The memory controller 315 can be configured to actively detect and recover from error occurrences (e.g., bit errors, operation errors, etc.) associated with various operations or storage of data, while maintaining integrity of the data transferred between a host and a memory device, or maintaining integrity of stored data (e.g., using redundant RAID storage in the RAID unit 319, etc.), and can remove (e.g., retire) failing memory resources (e.g., memory cells, memory arrays, pages, blocks, etc.) to prevent future errors.

Figure 4:
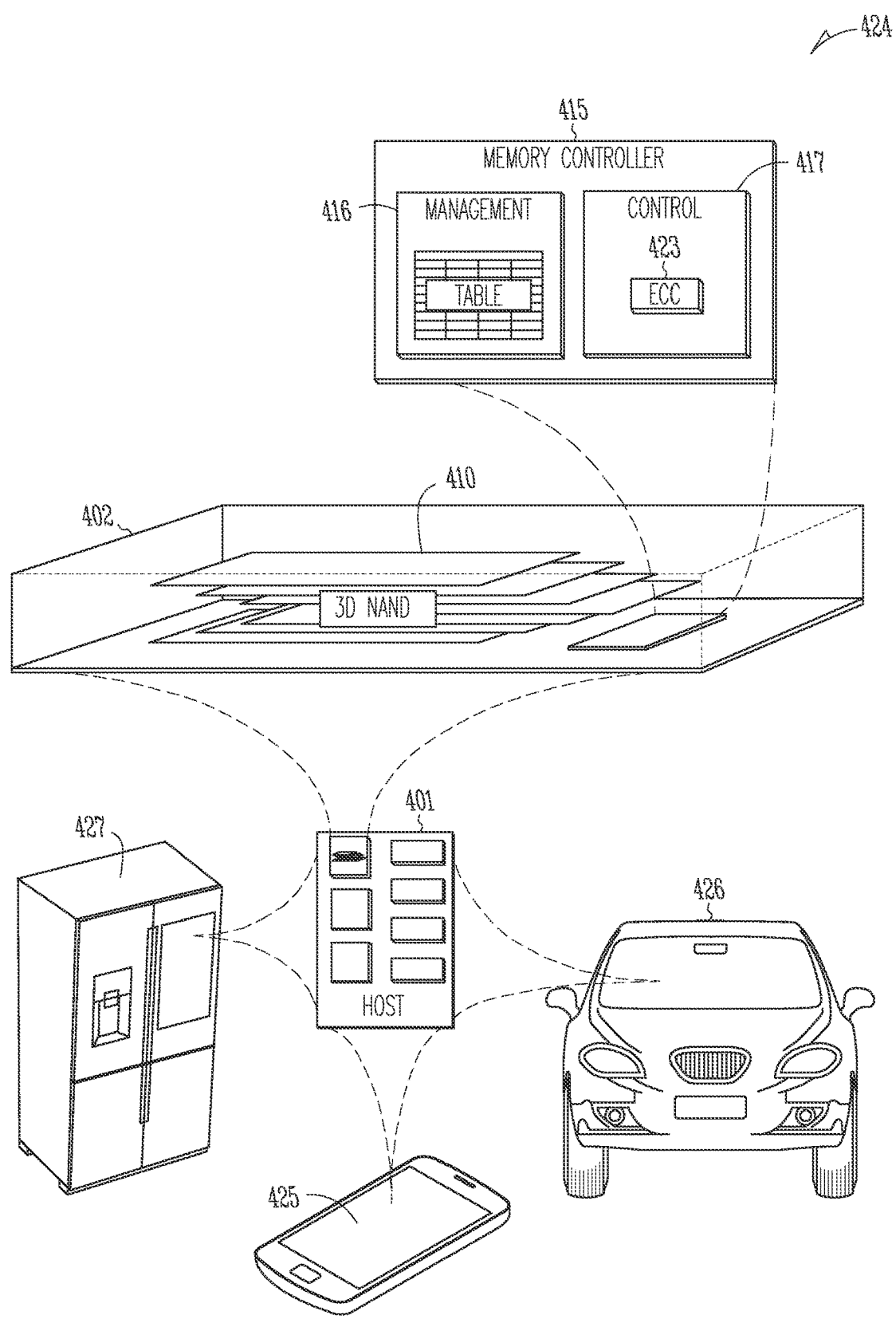
FIG. 4 illustrates an example of an environment including a host device and a managed memory device.

FIG. 4 illustrates an example of an environment 424 including a host device 401 and a managed memory device 402 configured to communicate with each other over a communication interface. Thus, as described herein, actions ascribed to the host device 401 are external to those of the managed memory device 402, even when, as illustrated, the managed memory device 402 is a package within the host device 401. Thus, in some examples, the managed memory device 402 may be included as part of the host 401 or the managed memory device 402 may be a separate component external to the host device 401. The host device 401 or the managed memory device 402 can be included in a variety of products, such as by way of example and not limitation, a mobile communication device 425, an automobile 426, an appliance 427, or other Internet of Things (IoT) devices (e.g.

sensor, motor or actuator, drone, etc.) to support processing, communications, or control of the product.

The managed memory device 402 includes a memory controller 415 and a memory array 410 including, for example, a number of individual memory devices (e.g., each memory device being a stack of three-dimensional (3D) NAND die). Thus, the managed memory device 402 includes the memory controller 415 and one or more memory devices. In examples without the managed memory device 402, the memory controller 415, or its equivalent, may be part of the host device 401 and external to the package of the memory device or devices that comprise the memory array 410. In 3D architecture semiconductor memory technology, vertical structures are stacked, increasing the number of tiers, physical pages, and accordingly, the density of a given memory device (e.g., a storage device).

In an example, the managed memory device 402 may be a discrete memory or storage device component of the host device 401. In other examples, the managed memory device 402 may be a portion of an integrated circuit (e.g., system on a chip (SOC), etc.), stacked or otherwise included with one or more other components of the host device 401.

One or more communication interfaces can be used to transfer data between the managed memory device 402 and one or more other components of the host device 401, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 401 may include a host system, an electronic device, a processor, control circuitry, or a memory card reader. In some examples, the host device 401 can be a machine having some portion, or all, of the components discussed in reference to the machine FIG. 4. Data can be transferred between the managed memory device 402 and other components over an I/O bus.

The memory controller 415 may receive instructions from processing circuitry (e.g., a processor) of the host device 401, and can communicate with the memory array 410, such as to transfer data to (e.g., write or erase) or from (e.g., read) one or more of the memory devices and associated memory cells, planes, sub-blocks, blocks, or pages of the memory array 410. The memory controller 415 may include, among other things, circuitry or firmware, including one or more components or integrated circuits. For example, the memory controller 415 may include one or more circuits, control circuitry, or components configured to control access across the memory array 410 and to provide a translation layer between the host device 401 and the memory devices of the memory array 410. The memory controller 415 may include one or more input/output (I/O) circuits, lines, or interfaces to transfer data to or from the memory array 410. The memory controller 415 may include a memory manager 416 and an array controller 417. The array controller 417 may include, among other things, circuitry or components configured to control memory operations associated with writing data to, reading data from, or erasing one or more memory cells of the memory devices in the memory array 410. The memory operations can be based on, for example, host commands received from processing circuitry of the host device 401, or internally generated by the memory manager 416 (e.g., in association with wear leveling, error detection or correction, etc.).

In operation, data is typically written to or read from the NAND managed memory device 402 in pages and erased in blocks. However, one or more memory operations (e.g., read, write, erase, etc.) can be performed on larger or smaller groups of memory cells, as desired. The data transfer size of a NAND managed memory device 402 is typically referred to as a page, whereas the data transfer size of a host is typically referred to as a sector.

The array controller 417 may include an error correction code (ECC) component 423, which can include, among other things, an ECC engine or other circuitry configured to detect or correct errors associated with writing data to or reading data from one or more memory cells of the memory devices coupled to the memory controller 415. The memory manager 416 may include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection (e.g., bit-error-rate (BER) monitoring) or correction, block retirement, or one or more other memory management functions. The memory manager 416 may parse or format host commands (e.g., commands received from processing circuitry of host device 401) into device commands (e.g., commands associated with operation of a memory array, etc.), or generate device commands (e.g., to accomplish various memory management functions) for the array controller 417 or one or more other components of the managed memory device 424. In an example, some of these operations can be implemented in a memory control unit of each memory device in the memory array 120. The memory manager may also perform operations associated with data error in MLC memory by tracking bits in lowest VT level of charge distribution and highest VT level of charge distribution, as will be described in more detail below.

The memory array 410 can include one or more memory devices. The individual memory devices can include several memory cells arranged in, for example, a number of devices, planes, sub-blocks, blocks, or pages. As one example, a 48 GB TLC NAND memory device can include 18.592 bytes of data per page (16,384+2208 bytes), 1536 pages per block, 548 blocks per plane, and four or more planes per device. As another example, a 32 GB MLC memory device (storing two bits of data per cell (i.e., four programmable states)) can include 18.592 bytes of data per page (16,384+2208 bytes), 1024 pages per block, 548 blocks per plane, and four planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC. QLC, etc.).

Different types of memory devices can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash memory device can have a higher bit error rate than a corresponding single-level cell (SLC) NAND flash memory device. As such, the MLC device can require more metadata bytes for error data than the corresponding SLC device.

Figure 5:
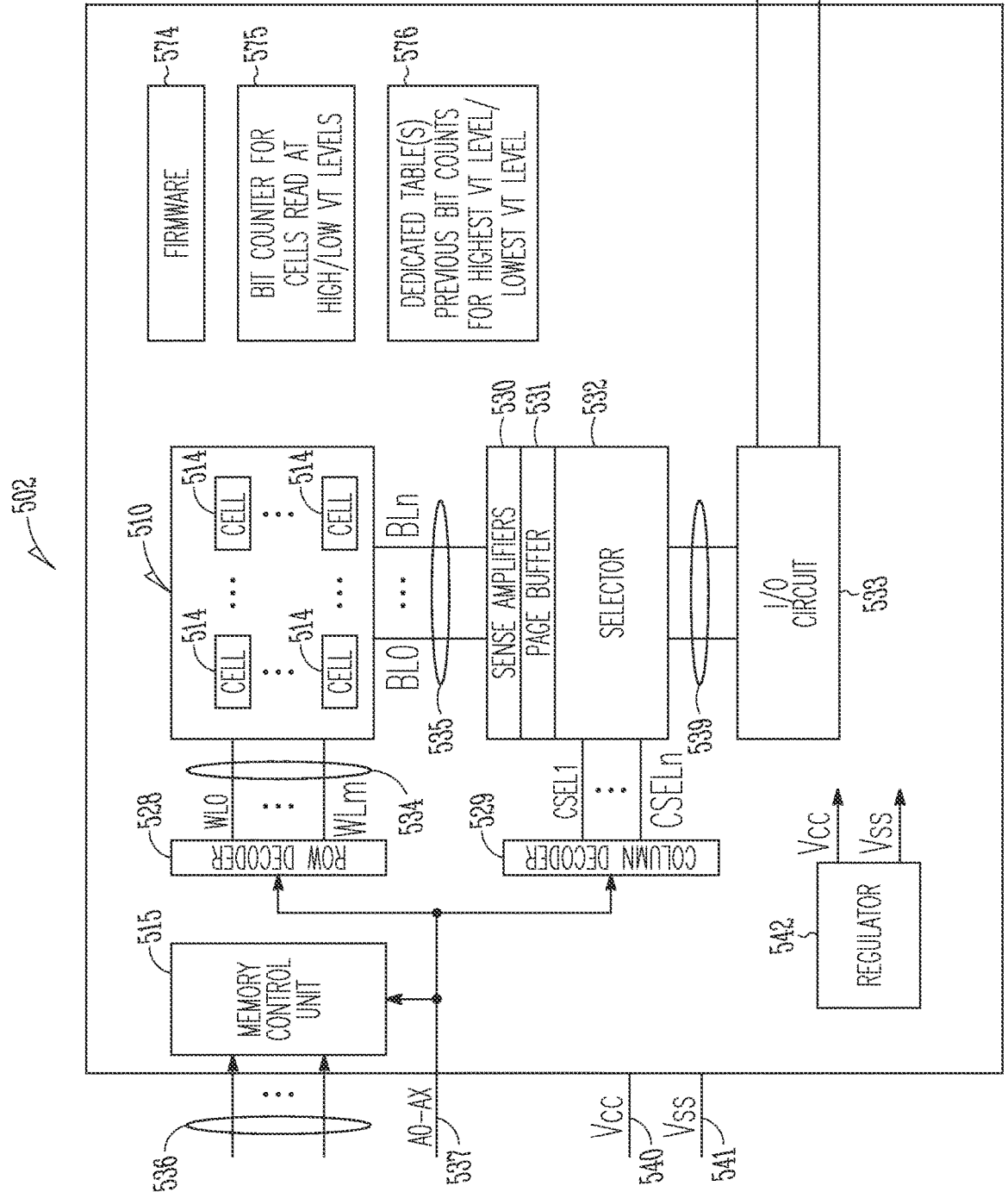
FIG. 5 illustrates an example block diagram of a memory device.

FIG. 5 illustrates an example block diagram of a memory device 502 including a memory array 510 having a plurality of memory cells 514, and one or more circuits or components to provide communication with, or perform one or more memory operations on, the memory array 510. The memory device 502 may include a row decoder 528, a column decoder 529, sense amplifiers 530, a page buffer 531, a selector 532, an input/output (I/O) circuit 533, and a memory control unit 515. The memory cells 514 of the memory array 510 can be arranged in rows, columns, pages, and blocks, and can be accessed using, for example, access lines 534, data lines 535, or one or more select gates, etc.

The memory control unit 515 can control memory operations of the memory device 502 according to one or more signals or instructions received on control lines 536, including, for example, one or more clock signals or control signals that indicate a desired operation (e.g., write, read, erase, etc.), or address signals (A0-AX) received on an address line 537. One or more devices external to the memory device 502 can control the values of the control signals on the control lines 536 or the address signals on the address line 537. Examples of devices external to the memory device 502 may include, but are not limited to, a host, a memory controller, a processor, or one or more circuits or components not illustrated in FIG. 5.

The memory device 502 may use access lines 534 and data lines 535 to transfer data to (e.g., write or erase) or from (e.g., read) one or more of the memory cells 514. The row decoder 528 and the column decoder 529 can receive and decode the address signals (A0-AX) from the address line 537, can determine which of the memory cells 514 are to be accessed, and can provide signals to one or more of the access lines 534 (e.g., one or more of a plurality of word lines (WL0-WLm)) or the data lines 535 (e.g., one or more of a plurality of bit lines (BL0-BLn)), such as described above.

The memory device 502 can include sense circuitry, such as the sense amplifiers 530, configured to determine the values of data on (e.g., read), or to determine the values of data to be written to, the memory cells 514 using the data lines 535. For example, in a selected string of memory cells, one or more of the sense amplifiers 530 can read a logic level in the selected memory cell in response to a read current flowing in the memory array through the selected string to the data lines 535.

One or more devices external to the memory device 502 can communicate with the memory device 502 using the I/O lines (DQ0-DQN) 538, address lines 537 (A0-AX), or control lines 536. The input/output (I/O) circuit 533 can transfer values of data in or out of the memory device 502, such as in or out of the page buffer 531 or the memory array 510, using the I/O lines 538, according to, for example, the control lines 536 and address lines 537. The page buffer 531 can store data received from the one or more devices external to the memory device 502 before the data is programmed into relevant portions of the memory array 510, or can store data read from the memory array 510 before the data is transmitted to the one or more devices external to the memory device 502.

The column decoder 529 can receive and decode address signals (A0-AX) into one or more column address signals (CSEL1-CSELn). The selector 532 (e.g., a select circuit) can receive the column select signals and select data in the page buffer 531 representing values of data to be read from or to be programmed into memory cells 514. Selected data can be transferred between the page buffer 531 and the I/O circuit 533 using data lines 539.

The memory control unit 515 can receive positive and negative supply signals, such as a supply voltage (Vcc) 540 and a negative supply (Vss) 541 (e.g., a ground potential), from an external source or supply (e.g., an internal or external battery, an AC-to-DC converter, etc.). In certain examples, the memory control unit 515 can include a regulator 542 to internally provide positive or negative supply signals.

In three-dimensional (3D) architecture semiconductor memory technology, vertical structures are stacked, increasing the number of tiers, physical pages, and accordingly, the density of a memory device (e.g., such as a storage device, described above).

The memory management of the memory device 502 may include firmware 574 used to implement data error detection and a data loss procedure, and may include at least one bit counter 575 for cells read at the high and low VT levels in order to count bits in the high and low VT distributions of charge, and dedicated table(s) 576 used to track the counted bits in the high and low VT distributions of charge. For example, the dedicated table(s) 576 may store bit count numbers for the lowest and highest VT level of charge distributions indicative of respective bit counts when the memory cells were programmed, and may also store a later instance of bit count numbers for the lowest and highest VT level of charge distributions. The firmware 574 may compare the later instance of bit count numbers to the recorded bit count numbers indicative of respective bit counts when the memory cells were programmed in order to determine if there has been changes in the bit counts. A change in the bit counts indicates changes from charge leakage or changes from read or write (program) disturbs.

Figure 6:
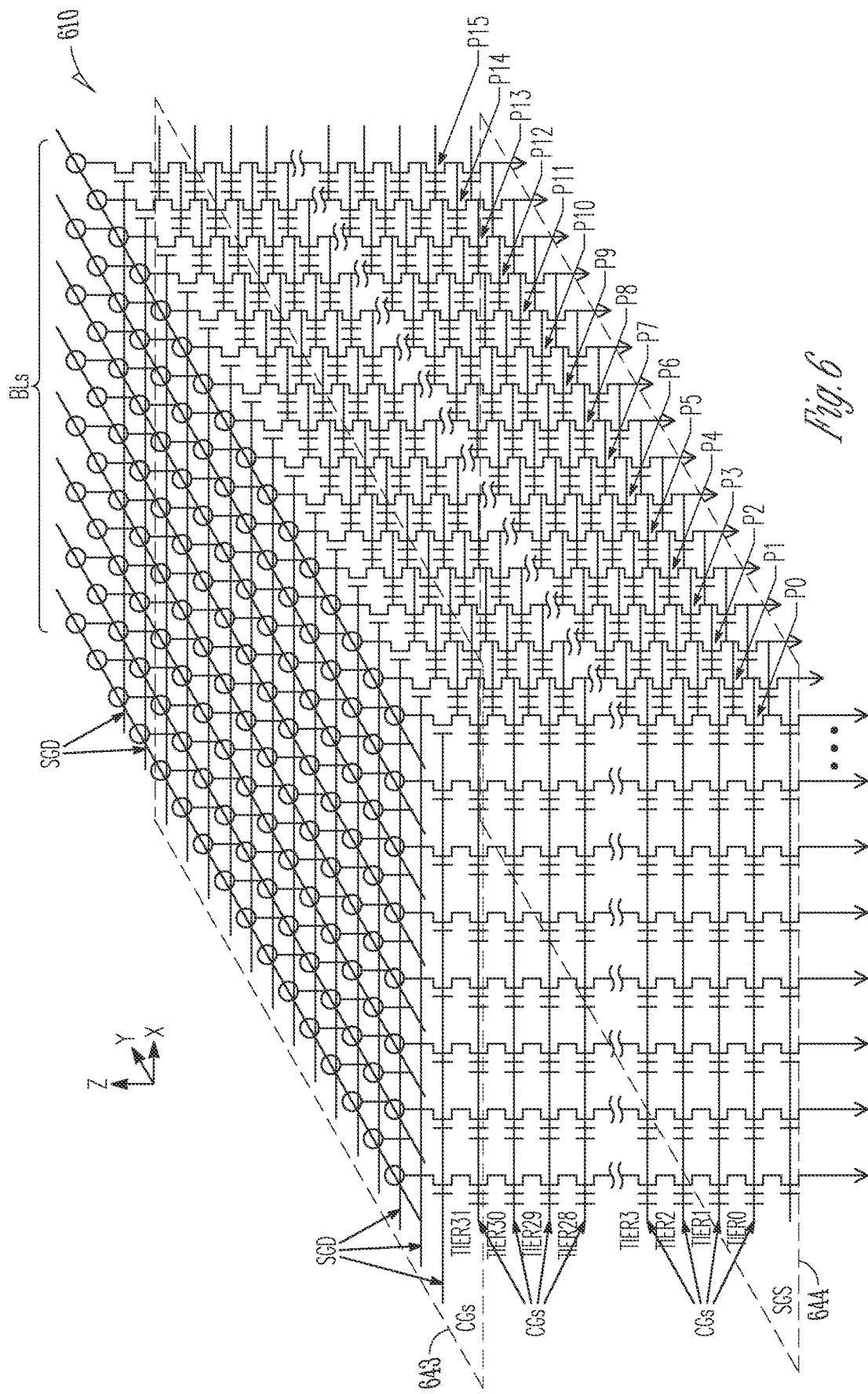
FIG. 6 illustrates an example schematic diagram of a 3D NAND architecture semiconductor memory array.

FIG. 6 illustrates an example schematic diagram of a 3D NAND architecture semiconductor memory array 610 including a plurality of strings of memory cells, each string including 32 tiers (TIER0-TIER31) of charge storage transistors stacked in the Z direction, source to drain, from a source-side select gate (SGS) to a drain-side select gate (SGD). Each string of memory cells in the 3D memory array can be arranged along the Y direction as data lines (e.g., bit lines (BL)), and along the X direction as physical pages (P0-P15). Within a physical page (e.g., P0), each tier represents a row of memory cells, and each string of memory cells represents a column. A block of memory cells can include a number of physical pages (e.g., 128, 384, etc.). In other examples, each string of memory cells can include more or less tiers (e.g., 8, 16, 64, 128, etc.), as well as one or more additional tiers of semiconductor material above or below the charge storage transistors (e.g., select gates, data lines, etc.), as desired.

Each memory cell in the memory array 610 includes a control gate coupled to (e.g., electrically or otherwise operatively connected to) an access line (e.g., word line), which collectively couples the control gates across a specific tier, or a portion of a tier, as desired. Specific tiers in the 3D memory array, and accordingly, specific memory cells in a string, can be accessed or controlled using respective access lines. For example, the memory device 610 includes a first level of semiconductor material 643 (e.g., polysilicon, etc.) that couples the control gates of each memory cell in TIER31, and a second level of semiconductor material 644 that couples the source-side select gates (SGS) of the array. Similar levels of metal or semiconductor material can couple the control gates for each tier. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 7:
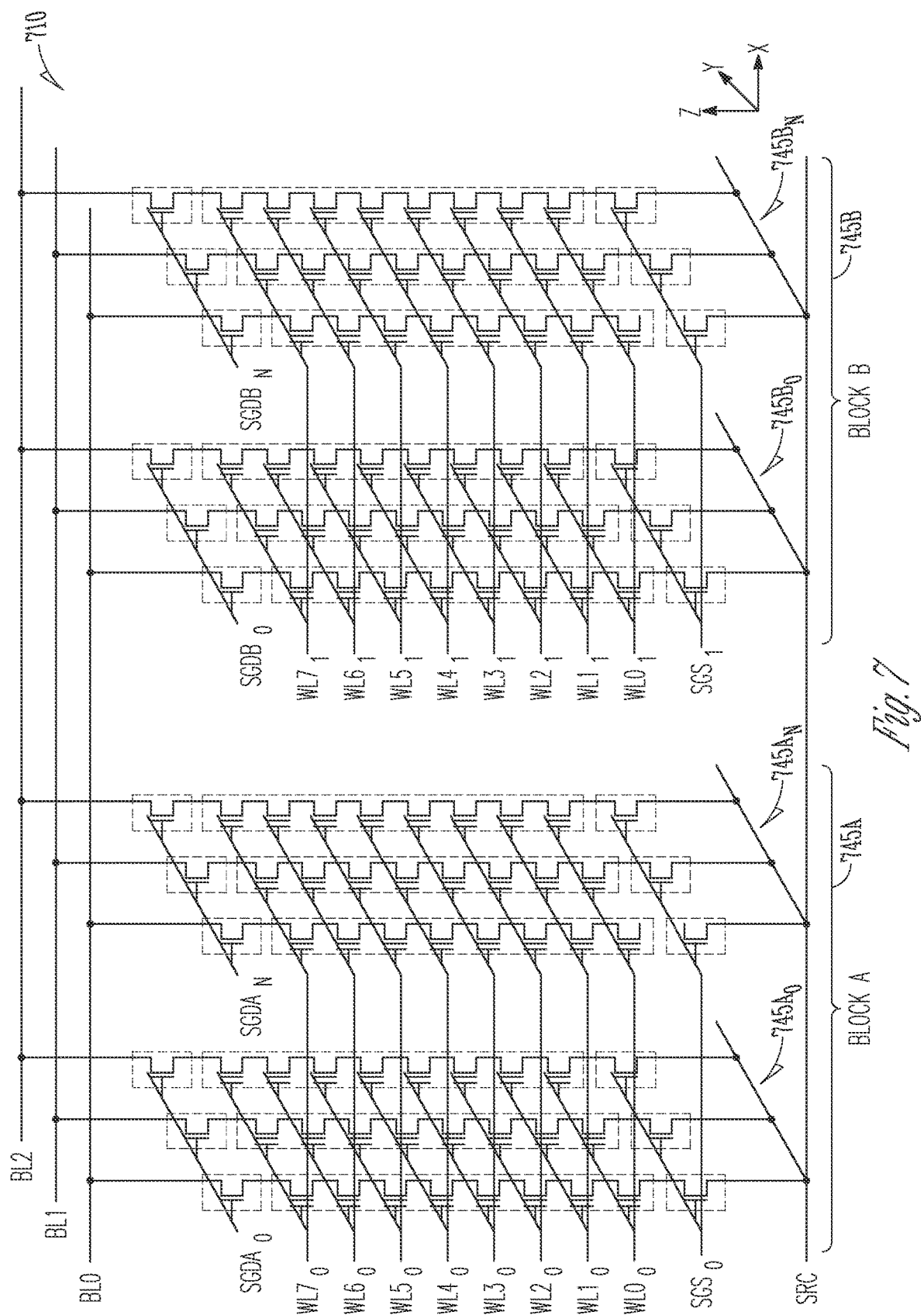
FIG. 7 illustrates another example schematic diagram of a 3D NAND architecture semiconductor memory array

FIG. 7 illustrates an example schematic diagram of a 3D NAND architecture semiconductor memory array 710 including strings of memory cells organized in blocks (e.g., block A 745A, block B 745B, etc.) and sub-blocks (e.g., sub-block A$_0$ 745A$_0$, sub-block A$_n$ 745A$_n$, sub-block B$_0$ 745B$_0$, sub-block 745$_n$ 301B$_n$, etc.). The memory array 710 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) or a source-side select gate (SGS) and a drain-side select gate (SGD). Each string of memory cells in the 3D memory array can be arranged along the X direction as data lines (e.g., bit lines (BL) BL0-BL2), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). The illustrated memory device provided for purposes of description includes two blocks, each block having two sub-blocks, each sub-block having a single physical page, with each physical page having three strings of memory cells, and each string having 8 tiers of memory cells. In actual devices, the memory array 300 will typically include a much greater number of blocks, sub-blocks, physical pages, strings of memory cells, memory cells, and/or tiers. For example, each string of memory cells can include a selected number of tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16.384+2208 bytes), 1536 pages per block, 548 blocks per plane, and 4 or more planes per device.

Each memory cell in the memory array 710 includes a control gate (CG) coupled to (e.g., electrically or otherwise operatively connected to) an access line (e.g., word lines (WL)), which collectively couples the control gates (CGs) across a specific tier, or a portion of a tier, as desired. Specific tiers in the 3D memory array 710, and accordingly, specific memory cells in a string, can be accessed or controlled using respective access lines. Groups of select gates can be accessed using various select lines.

Figure 8:
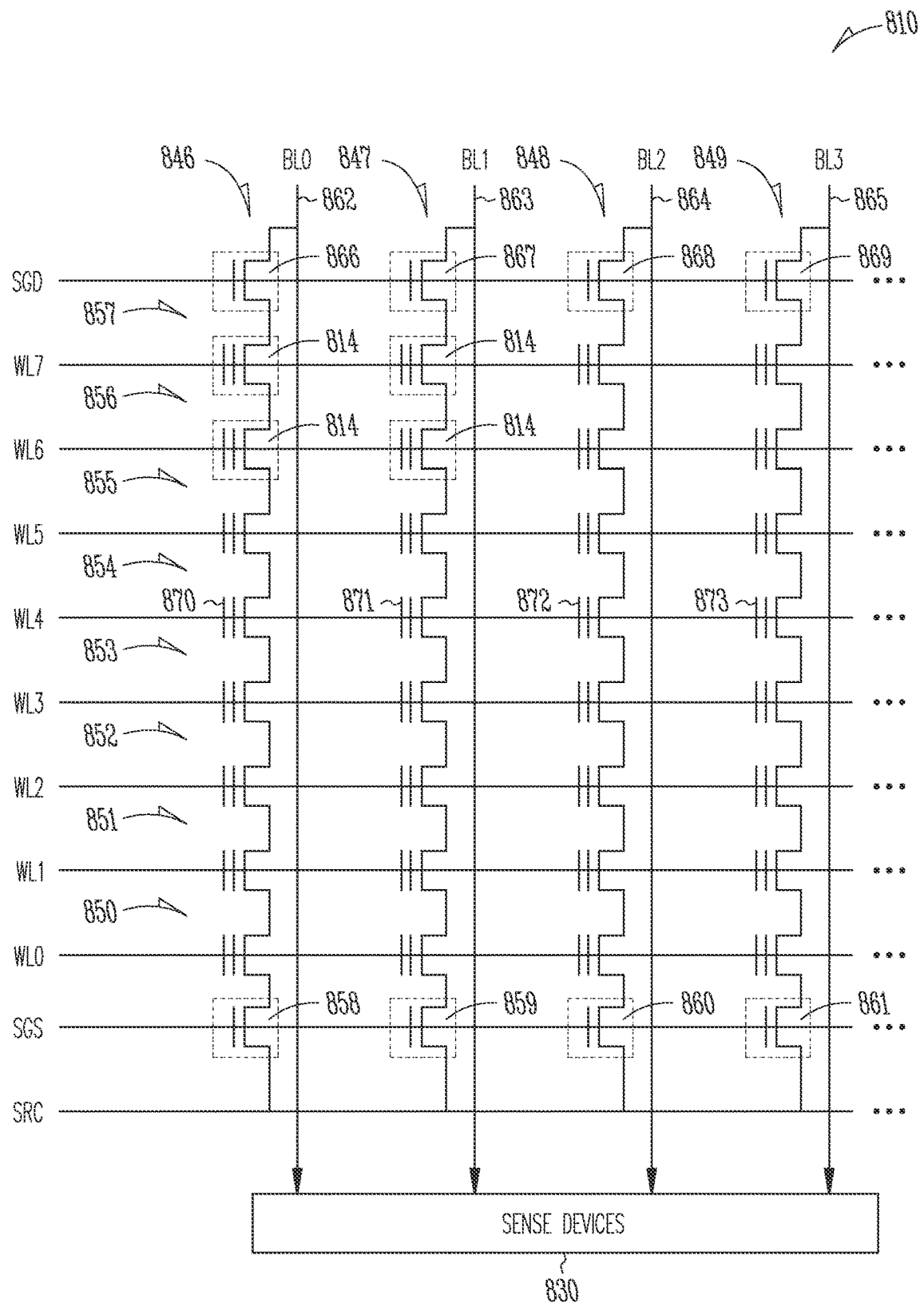
FIG. 8 illustrates another example schematic diagram of a portion of a 3D NAND architecture semiconductor memory array.

FIG. 8 illustrates an example schematic diagram of a portion of a 3D NAND architecture semiconductor memory array 810 including a plurality of memory cells 814 arranged in a two-dimensional array of strings (e.g., first, second, third, and fourth strings 846, 847, 848, 849) and tiers (e.g., TIER0-TIER7 850, 851, 852, 853, 854, 855, 856, 857), and sense amplifiers 830. For example, the memory array 810 can illustrate an example schematic diagram of a portion of a physical page of memory cells of a 3D NAND architecture semiconductor memory device. Each string of memory cells is coupled to a source line (SRC) using a respective source-side select gate (SGS) (e.g., first, second, third, or fourth SGS 858, 859, 860, 861), and to a respective data line (e.g., first, second, third, or fourth bit lines (BL0-BL3) 862, 863, 864, 865) using a respective drain-side select gate (SGD) (e.g., first, second, third, or fourth SGD 866, 867, 868, 869). Although illustrated with 8 tiers (TIER0-TIER7 912-926, e.g., using word lines (WL) WL0-WL7) and 4 data lines (BL0-BL3 928-934) in the example of FIG. 9, other examples can include strings of memory cells having more or less tiers (e.g., 16, 32, 64, etc.) or data lines, as desired.

In a NAND architecture semiconductor memory array, such as the example memory array 900, the state of a selected memory cell can be accessed by sensing a current or voltage variation associated with a particular data line containing the selected memory cell. The memory array 900 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL3), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first, second, third, or fourth control gates 870, 871, 872, 873 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, such that, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 830, coupled to one or more of the data lines (e.g., first, second, third, or fourth bit lines (BL0-BL3) 862, 863, 864, 865), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Having provided an overview discussion of systems that include memory devices, a more detailed discussion of detecting data error in MLC memory by tracking bits in lowest VT level of charge distribution and highest VT level of charge distribution. For example, a block scan may be executed where the number of bits in the higher and lower VT distributions are compared with the number of bits in these distributions which were stored at programming time.

The present subject matter may be used in managed NAND systems, as the controller of managed NAND systems intermittently or periodically read data to prevent data loss caused by retention and read disturb errors. Retention loss is an error that may be caused by charge leakage over the time. The leakage may be caused by damage gate oxide where the damage may have occurred because of repeated applications of high program/erase potentials. A read disturb describes an error that may occur when a read in one row of cells impacts the threshold voltage of flash cells in different rows in the same block, and may change the logical states of the programmed cells. Read disturbs may affect other pages then the page currently being read. Moreover, in some mobile firmware architectures, a block scan is performed after closing the block to check for read errors caused by defects activated but not detected by program operations, and performed before releasing a source block (in case of garbage collection operation) or checking parity (in some particular Redundant Array of Independent NAND (RAIN) schemes) with limited or no read error protection. The proposed method improves performance, power consumption and accuracy of those quite frequent operations. Garbage collection is a background operation that clears block(s) of data allowing the block(s) to be erased in preparation for new data to be written into the block(s). A RAIN engine processes read data using data stripes and parity bits. A stripe length represents the number of data elements associated with a parity bit. By way of example, seven data bits may be associated with one parity bit. Data within a stripe may be recovered using the parity bit and an XOR algorithm on the remaining data.

Since the effect of charge loss is more visible on the higher Vt distribution and the effect of read and program disturb mainly create a high tail on the lower (erased) distribution, the present inventors have recognized that it may be sufficient to count the bits in the highest VT distribution and the lowest VT distribution a single strobe. This improves the normal read operation which may require more (e.g. four) strobes. In addition, this NAND scan algorithm can optimize the transition between pages. For example, all word lines may be kept at Vpass when unselecting the previous read page and selecting the subsequent read page, thus saving precharge and discharge time further improve the speed improvements over a normal read operation.

In an example, the data error detection receives addresses for a set of memory cells. The set of memory cells may be one or more blocks, one or more pages within a block, or another set of memory cells. Thus, the received addresses may be received block addresses. A multi-plane operation may be performed on all of the word lines and all of the subblocks or a defined subset of those elements.

The discussion below uses a set of memory cells that includes at least one physical page. For each of these physical pages, the data error detection may use counters to determine bit counts and store the bit counts in a dedicated RAM spaces that will be transmitted all together at the end of the block (or a slice if the SRAM is limited). For example, the bit counts may be stored within management tables 318 in FIG. 3. Firmware may be used to compare the initial bit counts to the later-determined bit counts and to provide a reliability assessment based on the comparison. The initial counts used in the comparison may be retrieved at program time by the NAND and returned with the program status or by the controller during data transfer, and may be saved by the firmware in a dedicated table.

The memory device may implement various operations if it is determined that the set of memory cells is not reliable. The device may recover the data using ECC algorithms, and then may implement a garbage collection routine to prepare the cell to be erased in preparation for it to be used to program new data.

Figure 9:
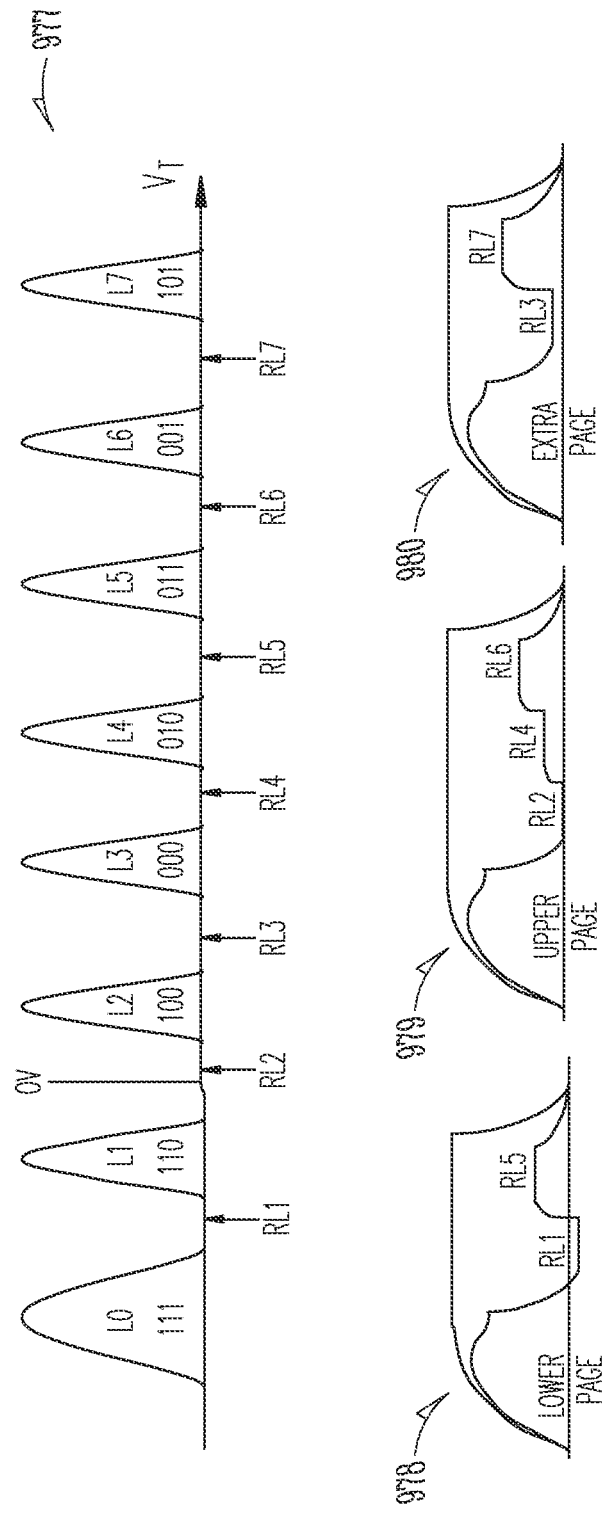
FIG. 9 illustrates an example of eight VT levels of charge distribution for a three bit MLC memory, along with the threshold potentials between the VT levels of charge distribution, and an indication of the potentials used to program each bit in the three bit MLC.

FIG. 9 illustrates an example of eight VT levels of charge distribution for a three bit MLC memory, along with the threshold potentials between the VT levels of charge distribution, and an indication of the potentials used to program each bit in the three bit MLC. The VT levels of charge distribution 977 are plotted along a line of increasing threshold voltage (VT). The charge distribution levels 977 include a lowest VT level of charge distribution (L0) and a highest VT level of charge distribution (L7). Each of the illustrated eight ($2^3$) levels is labeled with a corresponding three bit binary number. A read threshold level (RL) illustrates a threshold between the charge distributions. FIG. 9 also illustrates the various threshold voltage (VT) profiles associated with each bit of the 3 bit number. The first profile 978 corresponds to the value of the least significant bit, the second profile 979 corresponds to the value of the middle bit, and the third profile generally corresponds to the value of the most significant bit.

The first profile 978 includes a lower page region which corresponds to a 1 in the least significant bit, an RL1 region which corresponds to a 0 in the least significant bit, and an RL5 region which corresponds to a 1 in the least significant bit. The table 981 illustrates possible three-bit numbers for the different regions of the first profile 978. The second profile 979 includes an upper page region which corresponds to a 1 in the middle significant bit, a RL2 region which corresponds to a 0 in the middle significant bit, a RL4 region which corresponds to a 1 in the middle significant bit, and a RL6 region which corresponds to a 1 in the middle significant bit. The table 982 illustrates possible three-bit numbers for the different regions of the second profile 979. The third profile 980 includes an extra page region which corresponds to a 1 in the most significant bit, a RL3 region which corresponds to a 0 in the middle significant bit, and a RL7 region which corresponds to a 1 in the middle significant bit. The table 983 illustrates possible three-bit numbers for the different regions of the third profile 983. Notably, the lowest VT level of charge distribution (L0) is determined by the lower page region of the profile 978 which only corresponds to three bit number 111, and the highest VT level of charge distribution (L7) is determined by the RL7 region which only corresponds to three bit number 101. The bits (XX1) can be counted using the lower page bias potential and the bits (1XX) can be counted using the RL7 bias potential. A similar example may be illustrated for four ($2^2$) VT levels of charge distribution for a two bit MLC memory, or for four or more bit MLC memory.

Figure 10:
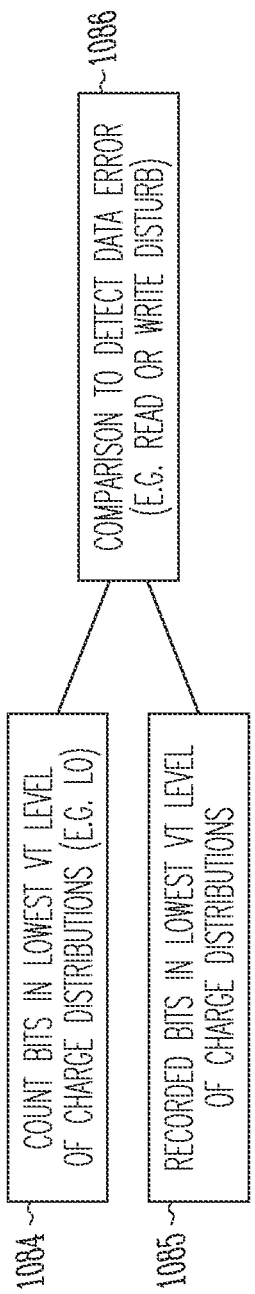
FIG. 10 illustrates an example for detecting data error in the lowest VT level of charge distributions.

FIG. 10 illustrates an example for detecting data error in the lowest VT level of charge distributions. At 1084 a firmware or hardware counter may be used to count bits in the lowest VT level of charge distributions (e.g. L0 in FIG. 9). This may be considered to be a present instance of counted bits. At 1085, counted bits in the lowest VT level of charge distributions (e.g. L0 in FIG. 9) may be have previously recorded. This may be considered to be an initial instance of counted bits indicative of the number of bits after programming. At 1086, the present instance of counted bits 1084 is compared to the initial instance of counted bit 1085 to detect data error such as may be attributable to read/write disturb errors.

Figure 11:
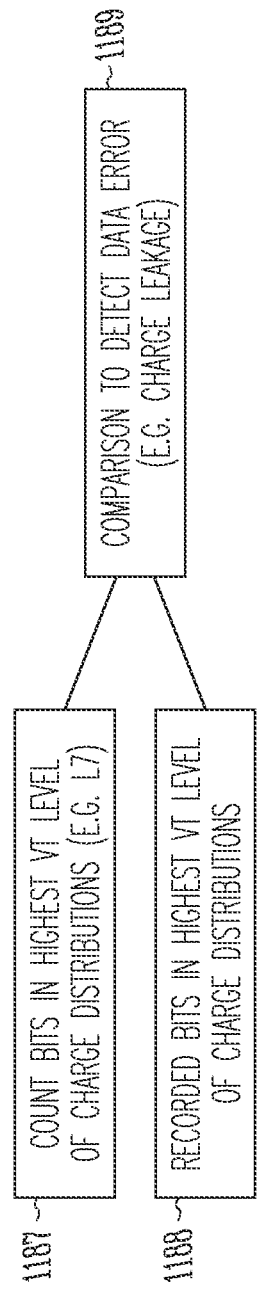
FIG. 11 illustrates an example for detecting data error in the highest VT level of charge distributions.

FIG. 11 illustrates an example for detecting data error in the highest VT level of charge distributions. At 1187 a firmware or hardware counter may be used to count bits in the highest VT level of charge distributions (e.g. L7 in FIG. 9). This may be considered to be a present instance of counted bits. At 1188, counted bits in the highest VT level of charge distributions (e.g. L7 in FIG. 9) may be have previously recorded. This may be considered to be an initial instance of counted bits indicative of the number of bits after programming. At 1189, the present instance of counted bits 1187 is compared to the initial instance of counted bit 1188 to detect data error such as may be attributable to charge leakage.

Figure 12:
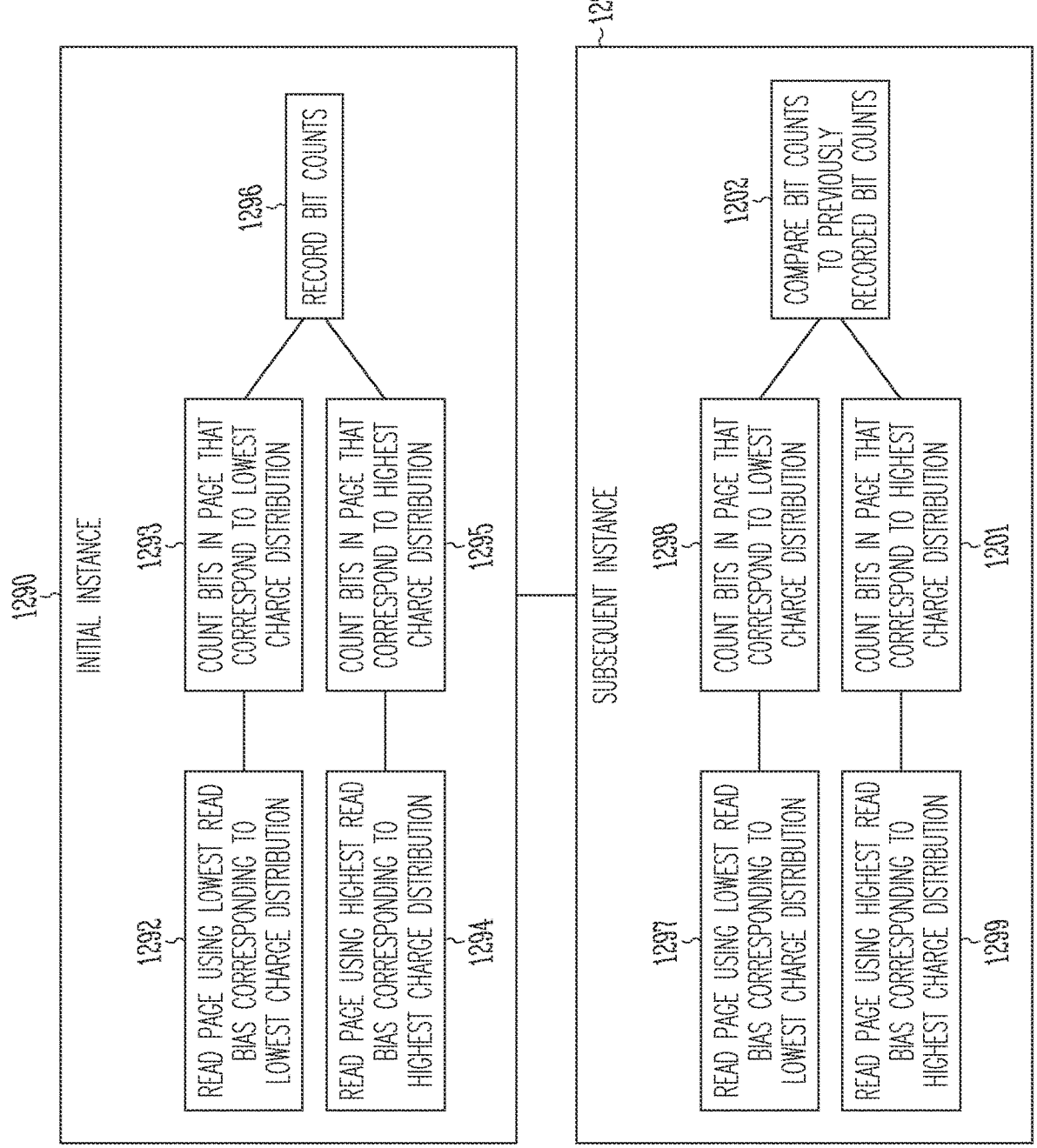
FIG. 12 illustrates an example for detecting data error by reading pages and counting bits in the highest and lowest VT levels of charge distributions within the read pages.

FIG. 12 illustrates an example for detecting data error by reading pages and counting bits in the highest and lowest VT levels of charge distributions within the read pages. The figure generally illustrates activities that occur at an initial instance 1290 (e.g. soon after a program) and that occur in a subsequent instance 1291 (e.g. an intermittent or periodic read) to ensure data integrity. The initial instance 1290 may include at 1292 reading a page using a lowest read bias corresponding to the lowest charge distribution, and at 1293 counting the bits in the page that correspond to the lowest charge distribution. The initial instance 1290 may further include at 1294 reading a page using a highest read bias corresponding to the highest charge distribution, and at 1295 counting the bits in the page that correspond to the highest charge distribution. The bit counts for the lowest and highest charge distributions may be recorded at 1296. The subsequent instance 1291 may include at 1297 reading a page using a lowest read bias corresponding to the lowest charge distribution, and at 1298 counting the bits in the page that correspond to the lowest charge distribution. The initial instance 1291 may further include at 1299 reading a page using a highest read bias corresponding to the highest charge distribution, and at 1201 counting the bits in the page that correspond to the highest charge distribution. At 1202 the bit counts for the subsequent instance 1291 may be compared to the bit counts for the initial instance 1290 to detect data loss.

Notably, the counting, storing and comparing of bits in the lowest and highest charge distributions is fast and low power. It does not use the ECC engine, which is generally slower and requires more energy as it reads the data. The faster and lower-powered routine may be used detect when there is a data error in the places most likely to experience the data error. For example, strobes may be used to control data transfers. The bits for the highest VT level of charge distributions and the bits in the lowest VT level of charge distributions are counted in one strobe. In contrast, multiple strobes may be needed to read the data for use by the ECC engine.

Examples have been given where the bits (or cells) for the lowest and highest VT levels of charge distribution are counted. However, the present subject matter may be practiced by counting the bits for more additional VT levels of charge distribution including all of the VT levels of charge distribution. Degradation may be identified by comparing current bit count numbers to recorded bit count numbers for the charge distributions For example, some embodiments of a memory device, include an array of non-volatile memory cells, wherein each of the memory cells is a multilevel cell configured to store at least two bits using multiple VT levels of charge distributions, and a memory controller configured for controlling access to the array of non-volatile memory cells. The memory controller may be configured to program memory cells within the array, record a data set where the data set includes a bit count number for each VT distribution within a set of memory cells, and identify degradations in the data set by comparing current bit count numbers to recorded bit count numbers in the data set. Some example embodiments may further reduce computation and memorization cost by limiting the comparing to at least one of a highest VT level of charge distribution or to a lowest VT level of charge distribution. For example, limiting the comparing may include recording a bit count number for a highest VT level of charge distributions within a set of memory cells that includes the programmed memory cells, recording a bit count number for a lowest VT level of charge distributions within the set of memory cells, and determining if there is a data error in the set of the memory cells by scanning the set of memory cells. Determining if there is a data error may include counting bits for the highest VT level of charge distributions within the scanned set of memory cells, counting bits in the lowest VT level of charge distributions within the scanned set of memory cells, comparing the counted bits for the highest VT level to the recorded bit count number for the highest VT level, and comparing the counted bits for the lowest VT level to the recorded bit count number for the lowest VT level.

Figure 13:
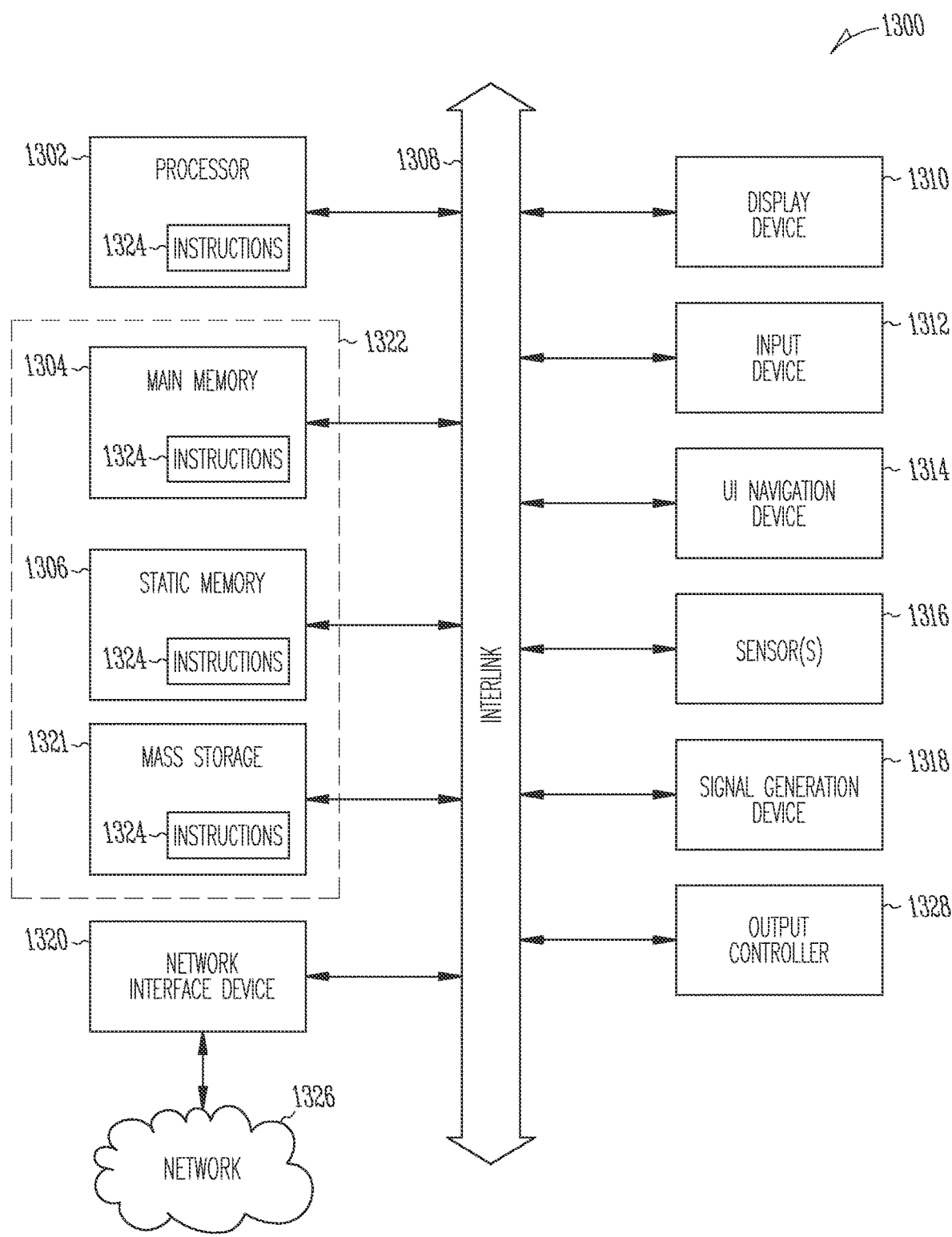
FIG. 13 illustrates a block diagram of an example machine upon which any one or more of the techniques (e.g., methodologies) discussed herein can perform.

FIG. 13 illustrates a block diagram of an example machine 1300 upon which any one or more of the techniques (e.g., methodologies) discussed herein can perform. In alternative embodiments, the machine 1300 can operate as a standalone device or can be connected (e.g., networked) to other machines. In a networked deployment, the machine 1300 can operate in the capacity of a server machine, a client machine, or both in server-client network environments. In an example, the machine 1300 can act as a peer machine in peer-to-peer (P2P) (or other distributed) network environment. The machine 1300 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 1300 (e.g., the host device 105, the managed memory device 110, etc.) can include a hardware processor 1302 (e.g., a central processing unit (CPU), a graphics processing unit (GPU), a hardware processor core, or any combination thereof, such as the memory controller 115, etc.), a main memory 1304 and a static memory 1306, some or all of which can communicate with each other via an interlink (e.g., bus) 1308. The machine 1300 can further include a display unit 1310, an alphanumeric input device 1312 (e.g., a keyboard), and a user interface (UI) navigation device 1314 (e.g., a mouse). In an example, the display unit 1310, input device 1312 and UI navigation device 1314 can be a touch screen display. The machine 1300 can additionally include a storage device (e.g., drive unit), a signal generation device 1318 (e.g., a speaker), a network interface device 1320, one or more sensors 1316, such as a global positioning system (GPS) sensor, compass, accelerometer, or other sensor. The machine 1300 can include an output controller 1328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

A machine-readable medium 1322 can include a storage device 1321 on which is stored one or more sets of data structures or instructions 1324 (e.g., software) embodying or utilized by any one or more of the techniques or functions described herein. The instructions 1324 can also reside, completely or at least partially, within the main memory 1304, within static memory 1306, or within the hardware processor 1302 during execution thereof by the machine 1300. In an example, one or any combination of the hardware processor 1302, the main memory 1304, the static memory 1306, or the storage device 1321 can constitute the machine-readable medium 1322. While the machine readable medium 1322 is illustrated as a single medium, the term "machine readable medium" can include a single medium or multiple media (e.g., a centralized or distributed database, or associated caches and servers) configured to store the one or more instructions 1324. The term "machine readable medium" can include any transitory or non-transitory medium that is capable of storing, encoding, or carrying transitory or non-transitory instructions for execution by the machine 1300 and that cause the machine 1300 to perform any one or more of the techniques of the present disclosure, or that is capable of storing, encoding or carrying data structures used by or associated with such instructions. Non-limiting machine-readable medium examples can include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1324 (e.g., software, programs, an operating system (OS), etc.) or other data are stored on the storage device 1321, can be accessed by the memory 1304 for use by the processor 1302. The memory 1304 (e.g., DRAM) is typically fast, but volatile, and is thus a different type of storage than the storage device 1321 (e.g., an SSD), which is suitable for long-term storage, including while in an "off" condition. The instructions 1324 or data in use by a user or the machine 1300 are typically loaded in the memory 1304 for use by the processor 1302. When the memory 1304 is full, virtual space from the storage device 1321 can be allocated to supplement the memory 1304; however, because the storage device 1321 is typically slower than the memory 1304, and write speeds are typically at least twice as slow as read speeds, use of virtual memory can greatly reduce user experience due to storage device latency (in contrast to the memory 1304. e.g., DRAM). Further, use of the storage device 1321 for virtual memory can greatly reduce the usable lifespan of the storage device 1321.

In contrast to virtual memory, virtual memory compression (e.g., the Linux® kernel feature "ZRAM") uses part of the memory as compressed block storage to avoid paging to the storage device 1321. Paging takes place in the compressed block until it is necessary to write such data to the storage device 1321. Virtual memory compression increases the usable size of memory 1304, while reducing wear on the storage device 1321.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing network speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1324 can further be transmitted or received over a communications network 1326 using a transmission medium via the network interface device 1320 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1320 can include one or more physical jacks (e.g., Ethernet, coaxial, or phone jacks) or one or more antennas to connect to the communications network 1326. In an example, the network interface device 1320 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

The above detailed description is intended to be illustrative, and not restrictive. The scope of the disclosure should, therefore, be determined with references to the appended claims, along with the full scope of equivalents to which such claims are entitled.

What is claimed is:

1. A method, comprising:
    programing memory cells using multiple levels of charge distributions, wherein the memory cells are multi-level cells (MLCs), and each of the MLCs are capable of representing more than one bit of data using the multiple levels of charge distributions;
    assessing reliability for at least one page of MLCs without applying error correction code (ECC) by:
        recording a bit count number for a highest level of charge distributions or a lowest level of charge distributions within the at least one page of MLCs;
        counting bits for the highest level of charge distributions or for the lowest level of charge distributions within the at least one page of MLCs without counting bits for all of the multiple levels of charge distributions;
        comparing the counted bits to the recorded bit count number; and
        determining the at least one page of MLCs is not reliable only when the counted bits and the recorded bit count number are not equal; and
    in response to determining that the at least one page of MLCs is not reliable, performing operations to recover programmed data.

2. The method of claim 1, wherein firmware is used to record the bit count number for the highest level of charge distributions or the lowest level of charge distributions.

3. The method of claim 1, wherein the recorded bit count number is indicative of a bit count when the memory cells were programmed.

4. The method of claim 1, further comprising using strobes to control timing for data transfers, wherein the bits for the highest level of charge distributions and the bits in the lowest level of charge distributions are counted in one strobe.

5. The method of claim 1, wherein the determining does not use an Error Correction Code (ECC) engine.

6. The method of claim 1, wherein the multiple levels of charge distributions include at least four levels of charge distributions for representing at least two bits of data per memory cell.

7. A method, including:
    programing memory cells using multiple levels of charge distributions, wherein the memory cells are multi-level cells (MLCs), and each of the MLCs are capable of representing more than one bit of data using the multiple levels of charge distributions;
    assessing reliability for at least one page of MLCs without applying error correction code (ECC) by:
        recording a bit count number for a highest level of charge distribution within the at least one page of MLCs; and
        counting bits for the highest level of charge distributions within the at least one page of MLCs without counting bits for all of the multiple levels of charge distributions;
        comparing the counted bits to the recorded bit count number; and
        determining the at least one page of MLCs is not reliable only when the counted bits are not equal to the recorded bit count number and
    in response to determining that the at least one page of MLCs is not reliable, performing operations to recover programmed data.

8. The method of claim 7, wherein firmware is used to record the bit count number for the highest level of charge distribution.

9. The method of claim 7, wherein the recorded bit count number for the highest level of charge distributions is indicative of a bit count for the highest level of charge distribution when the memory cells were programmed.

10. The method of claim 7, wherein the multiple levels of charge distributions include at least four levels of charge distributions for representing at least two bits of data per memory cell.

11. A method, including:
    programing memory cells using multiple levels of charge distributions, wherein the memory cells are multi-level cells (MLCs), and each of the MLCs are capable of representing more than one bit of data using the multiple levels of charge distributions;

assessing reliability for at least one page of MLCs without applying error correction code (ECC) by:
recording a bit count number for a lowest level of charge distribution within the at least one page of MLCs; and
counting bits for the lowest level of charge distributions within the at least one page of MLCs without counting bits for all of the multiple levels of charge distributions;
comparing the counted bits to the recorded bit count number; and
determining the at least one page of MLCs is not reliable only when the counted bits are not equal to the recorded bit count number; and
in response to determining that the at least one page of MLCs is not reliable, performing operations to recover programmed data.

12. The method of claim 11, wherein firmware is used to record the bit count number for the lowest level of charge distribution.

13. The method of claim 11, wherein the recorded bit count number for the lowest level of charge distributions is indicative of a bit count for the lowest level of charge distribution when the memory cells were programmed.

14. The method of claim 11, wherein the multiple levels of charge distributions include at least four levels of charge distributions for representing at least two bits of data per memory cell.

15. A memory device, comprising:
memory cells configured to establish multiple levels of charge distributions, wherein the memory cells are multi-level cells (MLCs), and each of the MLCs are capable of representing more than one bit of data using the multiple levels of charge distributions; and
a memory controller configured to perform operations on the memory cells, the operations including:
program the MLCs;
assess reliability for at least one page of MLCs without applying error correction code (ECC) by:
recording a data set, the data set including a bit count number for at least one of a highest level of charge distributions or a lowest level of charge distributions within the at least one page of MLCs; and
counting bits for the highest level of charge distributions or for the lowest level of charge distributions within the at least one page of MLCs without counting bits for all of the multiple levels of charge distributions;
comparing the counted bits to the recorded bit count number; and
determining the at least one page of MLCs is not reliable only when the counted bits and the recorded bit count number are not equal; and
perform operations to recover programmed data in response to determining that the at least one page of MLCs is not reliable.

16. The memory device of claim 15, wherein the data error includes a read disturb or a write disturb, wherein the recorded bit count number and the counted bits correspond to the lowest level of charge distributions.

17. The memory device of claim 15, wherein the data error includes charge leakage, wherein the recorded bit count number and the counted bits correspond to the highest level of charge distributions.

18. The memory device of claim 15, further comprising using firmware to count bits and to compare the counted bits.

19. The memory device of claim 15, wherein firmware is used to count bits and compare the counted bits to the recorded bit count number.

20. A system, comprising:
a host controller configured to serially communicate with a memory device; and
the memory device includes memory cells and a memory controller configured to perform operations on the memory cells, the memory cells being configured to establish multiple levels of charge distributions, wherein the memory cells are multi-level cells (MLCs) and each of the MLCs are capable of representing more than one bit of data using the multiple levels of charge distributions, the operations including:
program the MLCs;
assess reliability for at least one page of MLCs without applying error correction code (ECC) by:
recording a data set, the data set including a bit count number for at least one of a highest level of charge distributions or a lowest level of charge distributions within the at least one page of MLCs; and
using firmware to count bits for the highest level of charge distributions or for the lowest level of charge distributions within the at least one page of MLCs without counting bits for all of the multiple levels of charge distributions, to compare the counted bits to the recorded bit count number, and to determine the at least one page of MLCs is not reliable only when the counted bits and the recorded bit count number are not equal; and
perform operations to recover programmed data in response to determining that the at least one page of MLCs is not reliable.

21. The system of claim 20, wherein the data error includes a read disturb or a write disturb, wherein the recorded bit count number and the counted bits correspond to the lowest level of charge distributions.

22. The system of claim 20, wherein the data error includes charge leakage, wherein the recorded bit count number and the counted bits correspond to the highest level of charge distributions.

* * * * *